United States Patent [19]

Nogami

[11] Patent Number: 4,894,561
[45] Date of Patent: Jan. 16, 1990

[54] CMOS INVERTER HAVING TEMPERATURE AND SUPPLY VOLTAGE VARIATION COMPENSATION

[75] Inventor: Kazutaka Nogami, Kawasaki, Japan

[73] Assignee: Kabushiki Kaisha Toshiba, Kawasaki, Japan

[21] Appl. No.: 256,664

[22] Filed: Oct. 13, 1988

[30] Foreign Application Priority Data

Dec. 18, 1987 [JP] Japan .................................. 62-320416

[51] Int. Cl.$^4$ ............................................. H03K 17/14
[52] U.S. Cl. .................................... 307/443; 307/451; 307/497; 307/263; 307/310
[58] Field of Search ............... 307/443, 448, 451, 475, 307/494–497, 577, 579, 585, 263, 270, 310

[56] References Cited

U.S. PATENT DOCUMENTS

| | | | |
|---|---|---|---|
| 4,473,762 | 9/1984 | Iwahashi et al. | 307/443 X |
| 4,593,203 | 6/1986 | Iwahashi et al. | 307/263 X |
| 4,645,948 | 2/1987 | Morris et al. | 307/310 X |
| 4,736,123 | 4/1988 | Miyazawa et al. | 307/579 X |
| 4,749,882 | 6/1988 | Morgan | 307/263 |
| 4,760,292 | 7/1988 | Bach | 307/310 X |
| 4,785,203 | 11/1988 | Nakamura | 307/448 |
| 4,792,704 | 12/1988 | Lobb et al. | 307/310 X |
| 4,797,579 | 1/1989 | Lewis | 307/443 |
| 4,825,101 | 4/1989 | Walters, Jr. | 307/263 X |
| 4,827,159 | 5/1989 | Naganuma | 307/263 X |

OTHER PUBLICATIONS

Wang et al., "A 21-ns 32K×8 CMOS Static RAM with a Selectively Pumped p-Well Array," IEEEE Journal of Solid State Circuits, vol. SC-22 No. 5, Oct. 1987, pp. 704-711.
Gubbels et al., "A 40 ns/100-pf Low-Power Full-CMOS 256K(32K×8) SCAM," IEEE Journal of Solid State Circuits, vol. SC-22, No. 5, Oct. 1987, pp. 741-747.

Primary Examiner—David Hudspeth
Attorney, Agent, or Firm—Finnegan, Henderson, Farabow, Garrett, and Dunner

[57] ABSTRACT

A semiconductor integrated circuit comprises a pair of P-channel and N-channel MOS output transistors connected in series between a power source voltage node and a ground node, a first logic circuit for controlling a gate potential of the P-channel MOS output transistor, a first current control circuit for controlling a current flowing into a ground potential path of the first logic circuit, a second logic circuit for controlling a gate potential of the N-channel MOS output transistor, a second current control circuit for controlling a current flowing into a power source potential path of the second logic circuit, and the first and second current control circuits having a current-temperature characteristic and a current-power source voltage characteristic which are inversely proportional to those of the MOS output transistors. With such an arrangement, the power source voltage dependency and the temperature dependency of the MOS output transistors are cancelled out by the control currents of the first and second current control circuits. Thus, the output voltage of the output circuit depends little on the change of the power source voltage and the operating temperature.

7 Claims, 7 Drawing Sheets

CMOS INVERTER HAVING TEMPERATURE AND SUPPLY VOLTAGE VARIATION COMPENSATION

BACKGROUND OF THE INVENTION

1. Field of the Invention

This invention relates to a semiconductor integrated circuit of the insulated gate type and, more particularly, to an output circuit in a semiconductor integrated circuit.

Figure 1:
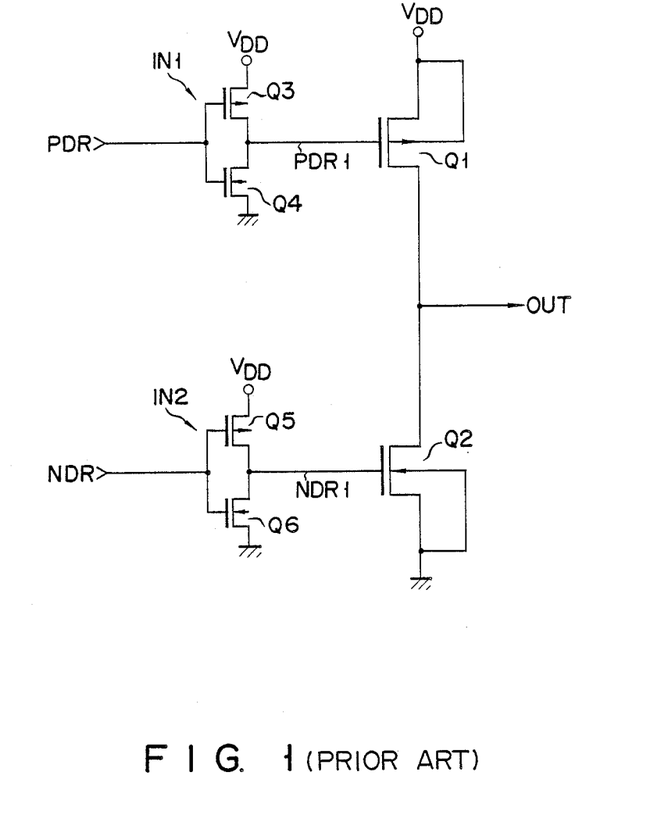
FIG. 1 shows a circuit diagram showing a conventional output circuit.

An example of the output circuit in a semiconductor integrated circuit of prior art is shown in FIG. 1. The output circuit is formed of P-channel output transistor Q1, N-channel output transistor Q2, and inverters IN1 and IN2. Inverter IN1 controls the gate voltage PDR1 of P-channel transistor Q1, and comprises P-channel transistor Q3 and N-channel transistor Q4. Inverter IN2 controls the gate voltage NDR1 of N-channel transistor Q2, and comprises P-channel transistor Q5 and N-channel transistor Q6.

When the above output circuit produces an output voltage OUT of high level "H", both the input signals PDR and NDR input to the inverters IN1 and IN2, which are supplied from a prestige output control circuit (not shown), change from low level "L" to high level "H". When input signals PDR and NDR change from low level "L" to high level "H", the gate voltages PDR1 and NDR1 both change their levels from "H" to "L". In turn, the output transistors Q1 and Q2 become in ON- and OFF-state, respectively. As a result, the output voltage OUT of "H" level is output from the output circuit. Under this condition, no rush-current flows through the path between a VDD power source terminal and a ground power source terminal.

To the contrary, when the output circuit produces an output voltage OUT of low level "L", both the input signals PDR and NDR change their levels from "H" to "L", and the gate voltages PDR1 and NDR1 both change their levels from "L" to "H". In turn, the output transistors Q1 and Q2 become in OFF- and ON-state, respectively. As a result, the output voltage OUT of "L" level is output from the output circuit. Also under this condition, no rush-current flows through the path between a VDD power source terminal and a Vss power source terminal.

Figure 2:
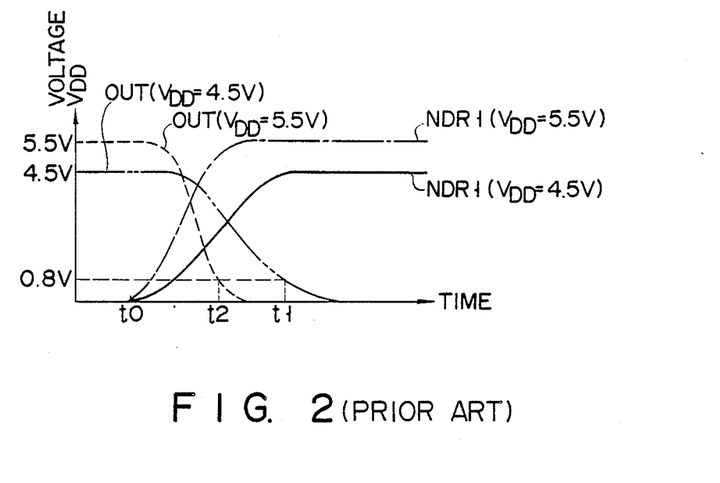
FIG. 2 shows a graphical representation of the power source voltage dependency of the output circuit of FIG. 1.

Variations of the gate voltage NDR1 and the output voltage OUT of the output circuit with respect to time are illustrated in FIG. 2, when VDD=4.5V and VDD=5.5V. As seen from the figure, the gate voltage NDR1 represented when VDD=5.5V steeply rises more than that represented when VDD=4.5V. This is due to the fact that the drive power of the P-channel transistor Q5 in the inverter IN2, which is represented when VDD=5.5V, is larger than that represented when VDD=4.5V. With the steep rise of the gate voltage, the output voltage OUT falls steeply. An excessively rapid fall of the output voltage, however, causes a variation of the output voltage. This arises from the inductance of the power source line connecting the VDD terminal with the output transistors Q1, and from the inductance of the power source line connecting the ground terminal with output transistor Q2. The voltage output variation may cause noise in the power source line and the ground line in the IC (integrated circuit) chip. The noise may bring about an erroneous operation of the circuit.

A simple measure for the above steep increase problem is to design the transistor Q5 so that the output voltage OUT gently rises for the high power source voltage, e.g., 5.5V. This is attained by determining the size of transistor Q5. However, this measure gives rise to another problem. When the power source voltage is low, e.g., 4.5V, the rise of the output voltage is too gentle. This results in a large delay of the output voltage OUT. The difference between the delay of the output voltage for the low power source voltage (VDD=4.5V) and the delay of the output voltage for the high power source voltage (VDD=5.5V) may be seen in FIG. 2. As seen in the figure, the output delay for the low power voltage (VDD=4.5V) ranges from time point t0 to t1. At time point t0, the output voltage OUT is 4.5V, and steady. At time point t1, the output voltage falls to reach a given voltage 0.8V. For the high power source voltage VDD=5.5V, the output delay ranges from time point t0 to t2. The time delay (t0 to t1) for the low power source voltage is approximately 1.3 times that (t0 to t2) for the high power voltage. Note here that in the semiconductor ICs, the operating speed has been set at the speed determined by the low power voltage. Therefore, when attempt is made to develop high speed semiconductor ICs, the output delay (t0 to t2) for the low power source voltage is the key to the success in the circuit development.

Figure 3:
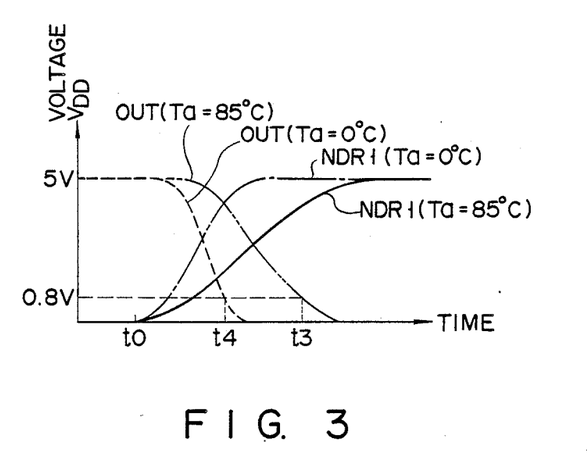
FIG. 3 shows a graphical representation of the temperature dependency of the output circuit of FIG. 1.

The prior art output circuit has similar problems when it is subjected to a temperature variation. When the output voltage OUT is changed from "H" to "L" level, variations of the gate voltage NDR 1 and the output voltage OUT under operating temperatures Ta=0° C. and Ta=85° C. may be plotted as shown in FIG. 3. When temperature Ta is low, i.e., Ta=0° C., the drive power of the transistor Q5 is high and hence the output voltage steeply falls. When temperature is high, Ta=85° C., the drive power of the transistor is small, and the output voltage OUT gently falls. Therefore, the output delay (t0 to t3) represented when Ta=85° C. is approximately 1.5 times that (t0 to t4) represented when Ta=0° C. Attempt to make the slope of the output voltage waveform more gentle at the low operating temperature Ta, for removing the erroneous operation of the circuit due to the noise in the IC chip, is led to a large output delay at the high temperature. This is a problem when the high speed ICs are handled.

SUMMARY OF THE INVENTION

Accordingly, an object of this invention is to provide a semiconductor integrated circuit, in which the dependency of an output voltage is small on the power source voltage and temperature, the circuit is operated at a high speed, and the noise in the IC chip is suppressed.

According to the invention, there is provided a semiconductor integrated circuit comprising: a pair of P-channel and N-channel MOS output transistors connected in series between a power source voltage node and a ground node; a first logic circuit for controlling a gate potential of the P-channel MOS output transistor; a first current control circuit for controlling a current flowing into a ground potential path of the first logic circuit; a second logic circuit for controlling a gate potential of the N-channel MOS output transistor; a second current control circuit for controlling a current flowing into a power source potential path of the second logic circuit; and the first and second current control circuits having a current-temperature characteristic and a current-power source voltage characteristic which are inversely proportional to those of the MOS output transistors.

With such an arrangement, the current flowing through the P-channel MOS transistor when it is turned on is controlled by the current of the first current control circuit when the output potential of the first logic circuit that controls the gate potential of that MOS output transistor, changes to the ground potential. Similarly, the current flowing through the N-channel MOS transistor when it is turned on is controlled by the current of the second current control circuit when the output potential of the second logic circuit that controls the gate potential of that MOS output transistor, changes to the power source potential. Consequently, the power source voltage dependency and the temperature dependency of the MOS output transistors are cancelled out by the control currents of the first and second current control circuits. Thus, the output voltage of the output circuit depends little on the change of the power source voltage and the operating temperature.

BRIEF DESCRIPTION OF THE DRAWINGS

FIG. 8 shows a graphical representation of the power source voltage dependency of the gate potential and the output voltage produced when the N channel MOS output transistor in the FIG. 4 output circuit is turned on;

FIG. 10 shows a graphical representation of the temperature dependency of the gate potential and the output voltage produced when the N channel MOS output transistor in the FIG. 4 output circuit is turned on;

DETAILED DESCRIPTION OF THE PREFERRED EMBODIMENTS

Preferred embodiments of this invention will be described with reference to the accompanying drawings.

Figure 4:
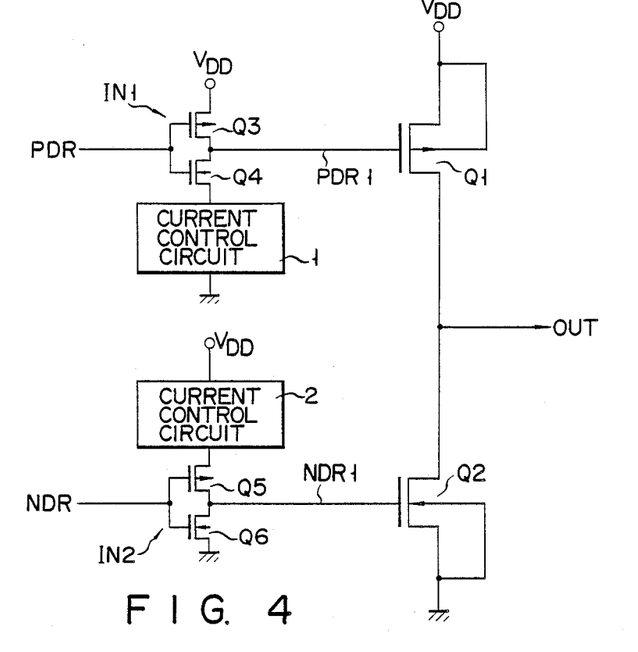
FIG. 4 shows a circuit diagram showing an output circuit in a semiconductor IC according to an embodiment of the invention.

FIG. 4 shows an output circuit in a MOS semiconductor integrated circuit according to an embodiment of the invention. The output circuit is formed of P-channel output transistor Q1, N-channel output transistor Q2, and inverters IN1 and IN2. The output transistors Q1 and Q2 are connected in series between a VDD power source node and a ground node. Inverter IN1 controls the gate voltage PDR1 of P-channel transistor Q1, and comprises P-channel MOS transistor Q3 and N-channel MOS transistor Q4, which are connected in series, with the gates being interconnected. The source of the P-channel MOS transistor Q3 is connected to the VDD power source node. A first current control circuit 1 is connected between the source of the N-channel MOS transistor Q4 and the ground node. Inverter IN2 controls the gate voltage NDR1 of N-channel transistor Q2, and comprises P-channel transistor Q5 and N-channel transistor Q6, which are connected in series, with the gates being interconnected. The source of the N-channel MOS transistor Q6 is connected to the ground node. A second current control circuit 2 is connected between the source of the P-channel MOS transistor Q5 and the ground node.

Figure 5:
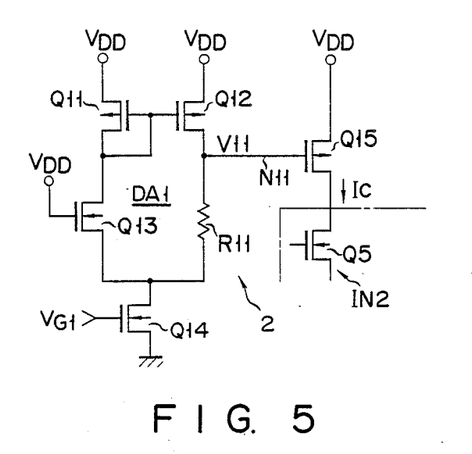
FIG. 5 shows a circuit diagram showing the second current control circuit used in the output circuit of FIG. 2.

The second current control circuit 2 may be arranged, for example, as shown in FIG. 5. The source of N-channel transistor Q13, which is coupled at the gate with the VDD voltage, is connected to one end of resistor R11, and is grounded through current restricting N-channel transistor Q14. Load P-channel transistor Q11 whose gate and drain are interconnected is inserted between the drain of transistor Q13 and the VDD power source node. P-channel transistor Q12, which is connected with transistor Q11 in a current mirror fashion, is connected between the other end of the resistor R11 and the VDD power source node. A connection point of the resistor R11 to transistor Q12 is connected to the gate of current restricting P-channel transistor Q15. The source of transistor Q15 is connected to the VDD power source, and its drain is connected to the source of the transistor Q5 in inverter IN2. The VDD power source voltage, for example, is used for the gate potential VG1 of current restricting transistor Q14.

Figure 6:
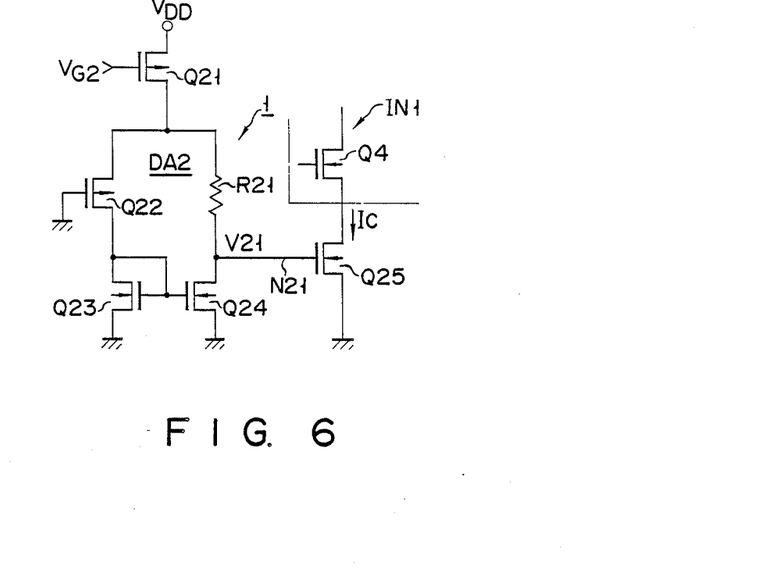
FIG. 6 shows a circuit diagram showing the first current control circuit used in the output circuit of FIG. 2.

The first current control circuit 1 may be arranged as shown in FIG. 6, for example. The circuit arrangement of this circuit 1 is symmetrical with that of the second current control circuit 2.

The source of P-channel transistor Q22, which is coupled at the gate ground, is connected to one end of resistor R21, and is connected to the VDD power source node through current restricting P-channel transistor Q21. Load N-channel transistor Q23 whose gate and drain are interconnected is inserted between the drain of transistor Q22 and the ground source node. N-channel transistor Q24, which is connected with transistor Q23 in a current mirror fashion, is connected between the other end of the resistor R21 and the ground node. A connection point of the resistor R21 to transistor Q24 is connected to the gate of current restricting N-channel transistor Q25. The drain of transistor Q25 is connected to the source of the transistor Q4 in inverter IN1, and its source is grounded. The ground potential, for example, is used for the gate potential VG2 of current restricting transistor Q21.

The resistor R11 and R21 of the current control circuits are made of polysilicon or the like containing impurity at a high concentration, and depends little on temperature.

The gate of the N-channel transistor Q13, which is combined with resistor R11 to form differential amplifier DA1, is connected to the VDD power source voltage. Therefore, an equivalent resistance of this transistor Q13 becomes smaller, the higher the power source voltage is. Accordingly, a potential V11 at the output node N11 of differential amplifier DA1 is higher, the higher the power source voltage is. With increase of the potential V11, the gate potential of current restricting transistor Q15 becomes high. Consequently, a control current Ic, or the drain current, of this transistor Q15 becomes small. Thus, the power source voltage dependency of the control current Ic is inversely proportional to that of the drive power of MOS transistor Q5.

The equivalent resistance of the transistor Q13 becomes larger, the higher the temperature is. Therefore, with temperature increase, the output potential V11 of differential amplifier DA1 becomes low, and the control current becomes large. Thus, the temperature dependency of the control current Ic is inversely proportional to the drive power of MOS transistor Q5.

The above description of the second current control circuit 2 can also be applied to the first current control circuit 1. The power source voltage dependency and the temperature dependency of the control current Ic is inversely proportional to those of the drive power of MOS transistor Q4. In the first current control circuit 1 shown in FIG. 6, transistor Q22 and resistor R21 constitute a differential amplifier DA2 whose output is denoted as V21. The gate of transistor Q22 is grounded.

Figure 7:
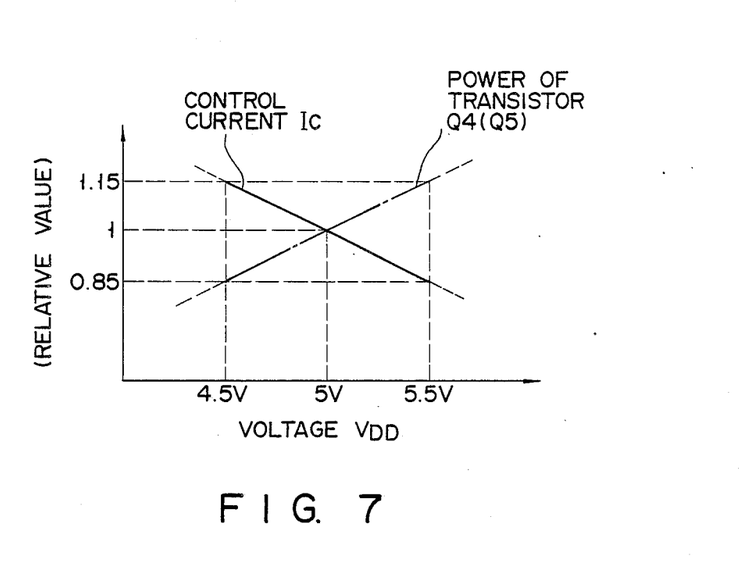
FIG. 7 shows a graph showing variations of the control current by each of the current control circuits and the drive power of the output transistor with respect to the power source voltage.

The power source voltage (VDD) dependency of each of the first and second current control circuits 1 and 2 is shown in FIG. 7. As seen from the figure, the VDD dependency is cancelled out by the drive power of MOS transistor Q4 (Q5). More specifically, the drive power of transistor Q4 represented when VDD=5.5V is about 15% higher than that represented when VDD=5.0V. The drive power for VDD=4.5V is decreased by about 15% from that for VDD=5.0V. On the other hand, the control current Ic for VDD=5.5V is decreased by about 15% for VDD=5.0V. The control current IC for VDD=4.5V is increased by about 15% from that for VDD=5.0V. The above data shows that the VDD dependency of the control current Ic is inversely proportional to that of the drive power of transistor Q4, and both the VDD dependency characteristics are cancelled out.

In the output circuit of FIG. 4 having the above property, when P-channel output transistor Q1 is turned on, this transistor Q1 is under control of the control current Ic of the first current control circuit 1 generated when the output potential of inverter IN1 changes to the ground potential. Therefore, the transistor Q1 depends little on temperature. Similarly, when N-channel output transistor Q2 is turned on, this transistor Q2 is under control of the control current Ic of the second current control circuit 2 generated when the output potential of inverter IN2 changes to the ground potential. Therefore, the transistor Q2 depends little on temperature.

When the output transistor Q1 is turned off, it is under the drive power of P-channel transistor Q3. When another output transistor Q2 is turned off, it is under the drive power of N-channel transistor Q6.

Figure 8:
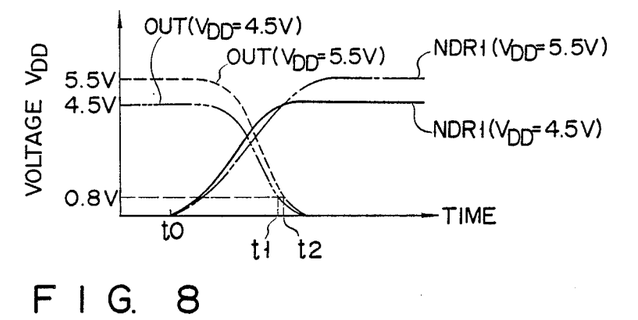

Turning now to FIG. 8, there are illustrated variations of the gate potential NDR1 and the output voltage OUT represented when the N-channel output transistor Q2, for example, is turned on at time t0. These variations are illustrated for two different VDD voltages, VDD=5.5V and VDD=4.5V. As recalled, the related current control circuit feeds such a control current Ic that it is large for the high VDD, 5.5V in this case, while it is small for the low VDD, 4.5V. Therefore, the gate potential NDR1 under VDD=4.5V steeply rises more than that under VDD=5.5V. This property is proved by the curves NDR1 (VDD=4.5V) and NDR1 (VDD=5.5V) in FIG. 8. It is noted that the property compensates for that drive power reduction of the output transistor Q2 that results from the source-drain voltage decrease of the transistor Q2 due to the VDD voltage drop from 5.5V to 4.5V. Thus, the output circuit of this embodiment, even under the low voltage of VDD=4.5V, can output the voltage at a high speed comparable with that represented under the high voltage, VDD=5.5.

Figure 9:
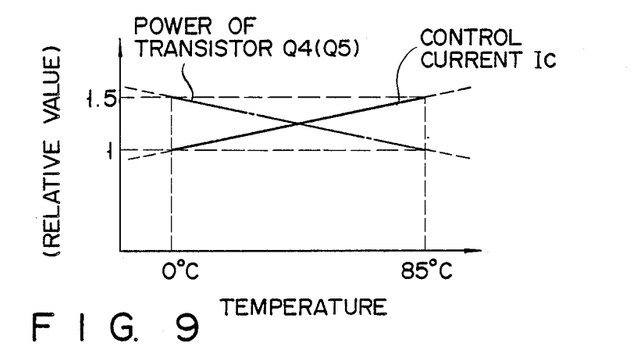
FIG. 9 shows a graphical representation of the temperature dependency of the control current of the current control circuit and the drive current for the output MOS transistor.
Figure 10:
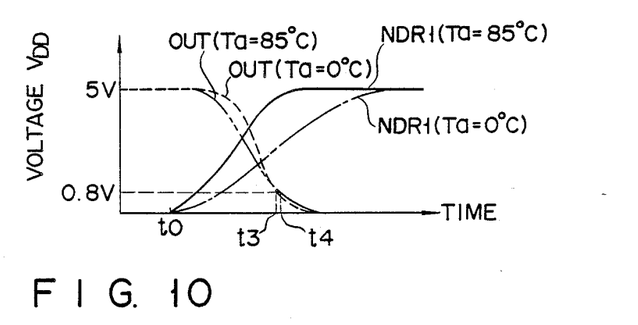

FIG. 9 shows a temperature dependency of the control current Ic of each current control circuit 1 and 2 in comparison with the temperature dependency of the drive power of each transistor Q4 and Q5. Both the temperature dependency characteristics are cancelled out each other. As shown, the drive power of the transistor Q4 or Q5 at 0° C. is 1.5 times that represented at 85° C., and the control current at 85° C. is 1.5 times that represented at 0° C. With this property, when the output transistor Q2 is turned on in the output circuit of FIG. 4, the gate potential NDR1 and the output voltage OUT under different temperatures 0° C. and 85° C. are varied as shown in FIG. 10. Since the control current at 85° C. is approximately 50% larger than that at 0° C., the reduction of the drive power of the transistor Q2 at 85° C. to approximately 1/1.5 of that at 0° C. can be compensated. The above property enables the output circuit to output the voltage OUT at substantially the same speeds at least in the temperature range between 0° C. and 85° C.

As seen from the foregoing, in the output circuit of this embodiment, the power source voltage (VDD) dependency and the temperature dependency of the transistors Q4 and Q5 in the inverters IN1 and IN2 are cancelled out by those characteristics of the corresponding current control circuits 1 and 2. Therefore, the waveforms of the output voltage OUT is kept substantially constant independent of the drive powers of the transistors Q4 and Q5. Practically, this is realized by designing the output circuit such that an output voltage waveform steeply varies to such an extent that the noise in the IC chip is not produced.

The resistor R11 in current control circuit 2 may be fabricated in the patterning process of a polysilicon wiring layer for the gate electrodes of the MOS transistors. In this case, a process variance exists, and the width of the electrode layers and resistor layers may be slightly narrower than the specified one. The width of the layers increases a resistance of the resistor R11, and subsequently increases the drive power of the transistor. Under this condition, the output potential V11 of differential amplifier DA1 increases and in turn the control current decreases. On the other hand, when the layers are slightly wider than the specified one, the resistance of the resistor decreases, and the transistor drive power decreases. The output potential V11 of differential amplifier DA1 becomes low, and the control current becomes large. The same thing is true for the first current control circuit 1. Thus, the change of the drive power due to the process variance is inversely proportional to the control current. This indicates that the output voltage OUT of the output circuit is stable against the process variance.

In the current control circuits 1 and 2, the current restricting MOS transistors Q14 and Q21 may be replaced with resistive elements made of polysilicon, for example, which depend little on the power source voltage and temperature.

Figure 11:
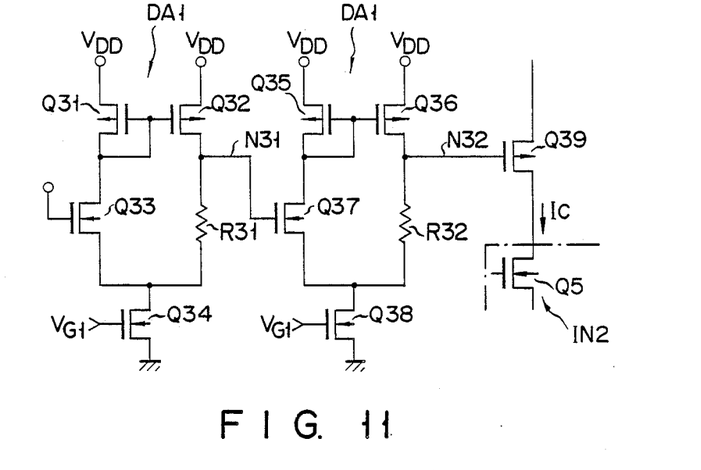
FIGS. 11 and 12 show circuit diagrams showing modifications of the first and second current control circuits of FIGS. 5 and 6.

Further in the current control circuit 2 shown in FIG. 5, the output potential of the single stage of differential amplifier DA1 is used for the gate control of current control transistor Q15. Two stages of the differential amplifiers may be used for the same purpose. A specific example of this is illustrated in FIG. 11. As shown, two differential amplifiers DA1 and DA1 provide an output potential for the gate control of transistor Q39. The arrangement of this current control circuit may provide a wide current control range according to the current control transistor.

Specifically, the source of N-channel transistor Q33, which is coupled at the gate with the VDD voltage, is connected to one end of resistor R31, and is grounded through current restricting N-channel transistor Q34. Load P-channel transistor Q31 whose gate and drain are interconnected is inserted between the drain of transistor Q33 and the VDD power source node. P-channel transistor Q32, which is connected with transistor Q31 in a current mirror fashion, is connected between the other end of the resistor R31 and the VDD power source node. A connection point of the resistor R31 and transistor Q32 is connected to the gate of N-channel transistor Q37. The source of N-channel transistor Q37 is connected to one end of resistor R32, and is grounded through N-channel transistor Q38. Load P-channel transistor Q35 whose gate and drain are interconnected is inserted between the drain of transistor Q37 and the VDD power source node. P-channel transistor Q36, which is connected with transistor Q35 in a current mirror fashion, is connected between the other end of the resistor R32 and the VDD power source node. A connection point of the resistor R32 to transistor R36 is connected to the gate of current restricting P-channel transistor Q39. The source of transistor Q39 is connected to the VDD power source, and its drain is connected to the source of the transistor Q5 in inverter IN2. The VDD power source voltage, for example, is used for the gate potential VGI of current restricting transistors Q34 and Q38.

Figure 12:
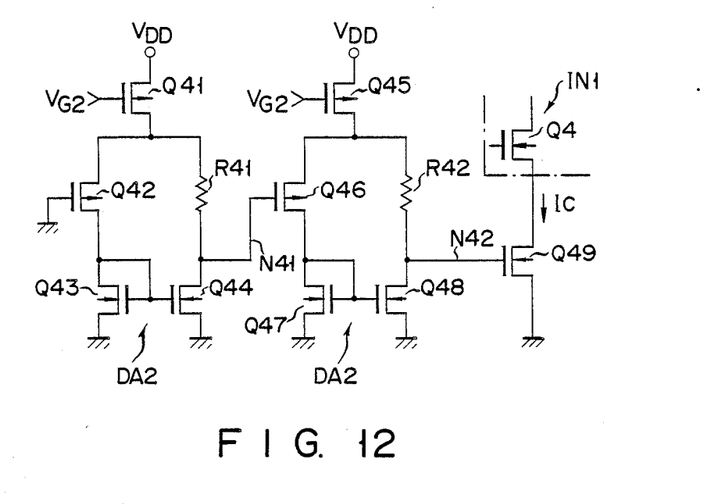

The same thing is true for the current control circuit 1 shown in FIG. 6. A modification of this control circuit is illustrated in FIG. 12. In this instance, two stages of differential amplifiers DA2 and DA2 provide a gate control potential for current control transistor Q49.

Specifically, the source of P-channel transistor Q42, which is coupled at the gate to ground, is connected to one end of resistor R41, and is connected to the VDD power source node through current restricting P-channel transistor Q41. Load N-channel transistor Q43 whose gate and drain are interconnected is inserted between the drain of transistor Q42 and the ground source node. N-channel transistor Q44, which is connected with transistor Q43 in a current mirror fashion, is connected between the other end of the resistor R41 and the ground node. A connection point of the resistor R41 to transistor Q44 is connected to the gate of P-channel transistor Q46. The source of P-channel transistor Q46 is connected to one end of resistor R42, and is connected to the VDD power source node through current restricting P-channel transistor Q45. Load N-channel transistor Q47 whose gate and drain are interconnected is inserted between the drain of transistor Q46 and the ground source node. N-channel transistor Q48, which is connected with transistor Q47 in a current mirror fashion, is connected between the other end of the resistor R42 and the ground node. A connection point of the resistor R42 to transistor Q48 is connected to the gate of current restricting N-channel transistor Q49. The drain of transistor Q49 is connected to the source of the transistor Q4 in inverter IN1, and its source is grounded. The ground potential, for example, is used for the gate potential VG2 of current restricting transistors Q41 and Q45.

Figure 13:
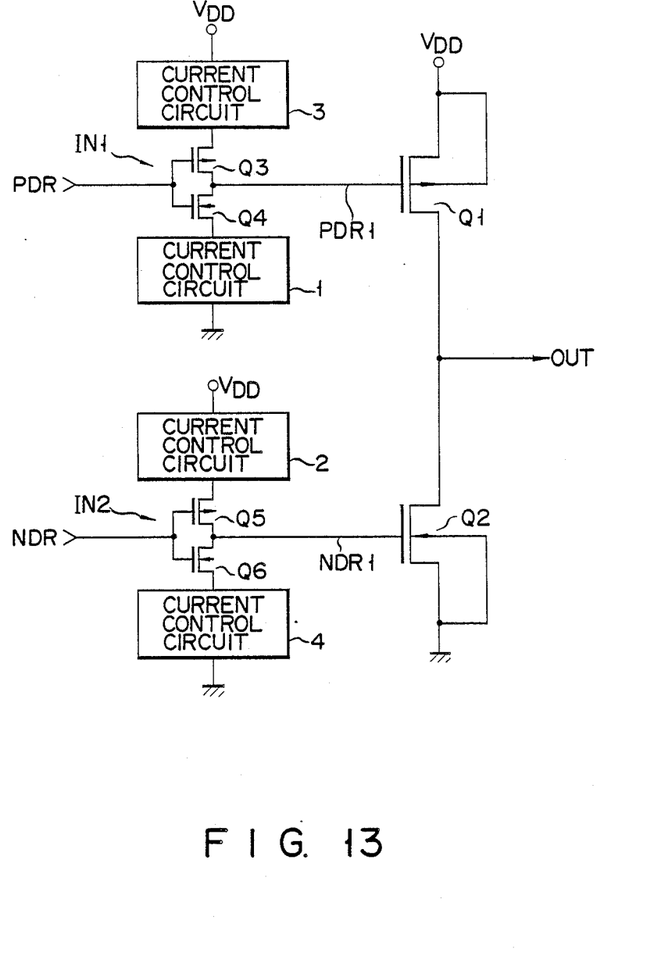
FIG. 13 shows a circuit diagram showing an output circuit in a semiconductor IC according to another embodiment of the invention.

In the output circuit of FIG. 4, inverter IN1 is provided with the single current control circuit 1 placed in the ground side. Similarly, inverter IN2 uses the current control circuit 2 in the same way. If necessary, however, the output circuit may be rearranged into an output circuit as shown in FIG. 13. As shown, inverter IN1 additionally uses a third current control circuit 3 placed in the power source potential path. The third current control circuit 3 has substantially the same circuit arrangement as the first current control circuit 1. Similarly, inverter IN2 uses an additional current control circuit, or a fourth current control circuit 4, placed in the ground potential path. The fourth current control circuit 4 has substantially the same circuit arrangement as the second current control circuit 2. When the output transistor Q1 is turned off in the output circuit of FIG. 13, the rise of the gate potential PDR1 may be controlled by third current control circuit 3. When another output transistor Q2 is turned off, the fall of gate potential NDR1 may be controlled by fourth current control circuit 4.

Further, inverters IN1 and IN2 for controlling the gate potentials of the output transistors Q1 and Q2 may be replaced by any other suitable logic circuit such as NAND and NOR.

As described above, the output circuit according to this invention is almost free from the power source voltage dependency and the temperature dependency. The delay of the output voltage may be kept constant. Even if the output delay is set up so as to suppress the noise in the IC chip, the output delay is invariable if the power source voltage changes. A high speed outputting of the output voltage is possible.

What is claimed is:

1. A semiconductor integrated circuit comprising:
   a pair of P-channel and N-channel MOS output transistors connected in series between a power source voltage node and a ground node;
   a first logic circuit for controlling a gate potential of said P-channel MOS output transistor;
   a first current control circuit for controlling a current flowing into a ground potential path of said first logic circuit;
   a second logic circuit for controlling a gate potential of said N-channel MOS output transistor;
   a second current control circuit for controlling a current flowing into a power source potential path of said second logic circuit; and
   said first and second current control circuits having a current-temperature characteristic and a current-power source voltage characteristic which are inversely proportional to those of said MOS output transistors.

2. A semiconductor integrated circuit according to claim 1, in which, in said second current control circuit, the output voltage of a first differential amplifier comprising an N-channel MOS transistor and a resistive element coupled in a differential manner is applied to the gate of a current controlling P-channel MOS transistor, and the output voltage of a second differential amplifier comprising a P-channel MOS transistor and a resistive element coupled in a differential manner is applied to the gate of a current controlling N-channel MOS transistor.

3. A semiconductor integrated circuit according to claim 2, in which two stages of said first differential amplifiers are used, and two stages of said second differential amplifiers are used.

4. A semiconductor integrated circuit according to claim 2, in which said resistive elements are made of the same material as the gates of said MOS transistors.

5. A semiconductor integrated circuit according to claim 1, further comprising a third current control circuit for controlling a current flowing through the power source potential path of said first logic circuit, and a fourth current control circuit for controlling a current flowing through the ground potential path of said second logic circuit, and said third current control circuit has substantially the circuit arrangement as said second current control circuit, and said fourth current control circuit has substantially the circuit arrangement as said first current control circuit.

6. A semiconductor integrated circuit according to claim 2, further comprising a third current control circuit for controlling a current flowing through the power source potential path of said first logic circuit, and a fourth current control circuit for controlling a current flowing through the ground potential path of said second logic circuit, and said third current control circuit has substantially the circuit arrangement as said second current control circuit, and said fourth current control circuit has substantially the circuit arrangement as said first current control circuit.

7. A semiconductor integrated circuit according to claim 4, further comprising a third current control circuit for controlling a current flowing through the power source potential path of said first logic circuit, and a fourth current control circuit for controlling a current flowing through the ground potential path of said second logic circuit, and said third current control circuit has substantially the circuit arrangement as said second current control circuit, and said fourth current control circuit has substantially the circuit arrangement as said first current control circuit.

* * * * *